United States Patent [19]

Ryan

[11] 3,943,471

[45] Mar. 9, 1976

[54] DIGITAL TUNING DEVICE

[76] Inventor: Paul A. Ryan, 5644 Lindenwood Road, Columbus, Ohio 43229

[22] Filed: Aug. 2, 1974

[21] Appl. No.: 494,245

[52] U.S. Cl. ................ 334/59; 331/179; 331/181; 334/56; 336/150
[51] Int. Cl.² ............................................ H03J 5/02
[58] Field of Search ...................... 331/181, 179; 334/55–59, 60, 61, 71–73; 336/150; 333/77; 325/458, 459, 464

[56] References Cited
UNITED STATES PATENTS 2,806,953    9/1957    Krauss ........................ 331/179 X

*Primary Examiner*—Siegfried H. Grimm
*Attorney, Agent, or Firm*—Pollock, Vande Sande & Priddy

[57] ABSTRACT

A digital tuning device for accurate selectable tuning of a resonant circuit. The inductive and capacitive elements of the resonant circuit are connected by a transformer device whose turns ratio is variable in accurate digital increments. Since the reflected reactance is related to the square of the turns ratio and since the resonant frequency varies as the inverse square root of the reactance, the resonant frequency of the circuit is directly related to the turns ratio.

9 Claims, 4 Drawing Figures

DIGITAL TUNING DEVICE

FIELD OF THE INVENTION

The present invention relates to a tuning device and more particularly and accurately selectable tuning device for many applications including radio receivers, filters, oscillators, etc.

BACKGROUND OF THE INVENTION

In many radio receiver applications it is important to be able to accurately tune a resonant circuit without relying on a signal strength as an indication of the tuning accuracy. This capability is particularly important in such applications as automatic direction finders for aircraft.

For navigational purposes many areas have a plurality of radio transmitting homing beacons located at known points and transmitting at predetermined frequencies. Each of these stations in any particular locality operates at a different frequency. A pilot, in navigating his aircraft may well wish to set his direction finder to the frequency of a beacon he is approaching. However, this act may occur at a time when the received signal is very weak or is not received at all. Furthermore, navigating an aircraft is a very demanding task and the pilot normally has many other duties to see to, other than refining the tuning of his direction finder.

For these and other reasons a desirable goal has been to provide an accurate tuning device which is accurately tunable to selectable different frequencies in the presence of a weak signal or no signal at all. A number of prior art tuners have been arranged to vary the tuning frequency in digital increments, and this is found to be quite useful and appropriate.

As reported by Ertman, in U.S. Pat. No. 3,244,983, conventional analog-type tuning with ganged tuning condensers in the RF and local oscillators cannot select, for example, a 1 kc signal in a 30 megacycle range. Tuning dials and condensers cannot be calibrated to accurately obtain such resolution even if the dials could be read by the operator.

Although the drawbacks in ganged tuning condensers are well known the solutions offered by Ertman in the afore-mentioned patent and by Bean in his U.S. Pat. No. 3,681,707 are exceedingly complex and thus expensive.

SUMMARY OF THE INVENTION

The present invention provides a simple and reliable tuning circuit which is capable of accurate selectable frequency control in digital increments and at the same time is simple and inexpensive.

The present invention contemplates a resonant circuit comprising an inductance and a capacitance which are connected together by means of a transformer device. The transformer device is a conventional ratio transformer which is so arranged that the output is related to the input by a selectable turns ratio with achievable accuracies to better than one part per million. With the components of the resonant circuit interconnected by the ratio transformer, one can consider either the reflected capacitance or reflected inductance which is related to the actual capacitance or inductance by the square of turns ratio. Since the resonant frequency of such a circuit is inversely proportional to the square root of the product of the inductance and capacitance, it is quite apparent that in the inventive circuit the resonant frequency is directly proportional to the turns ratio. Since the ratio transformer conventionally has a selectable variable turns ratio, with the afore-mentioned accuracies, the simple combination of an inductor, capacitor and a ratio transformer provides an accurate selectable resonant frequency for the circuit.

BRIEF DESCRIPTION OF THE DRAWINGS

Preferred embodiments of the present invention will be described with reference to the accompanying drawings in which like reference characters identify identical apparatus and in which.

DETAILED DESCRIPTION OF THE INVENTION

Before describing the present invention it will be worthwhile to review the characteristics of the ratio transformer as a basis for the description which follows.

Figure 1:
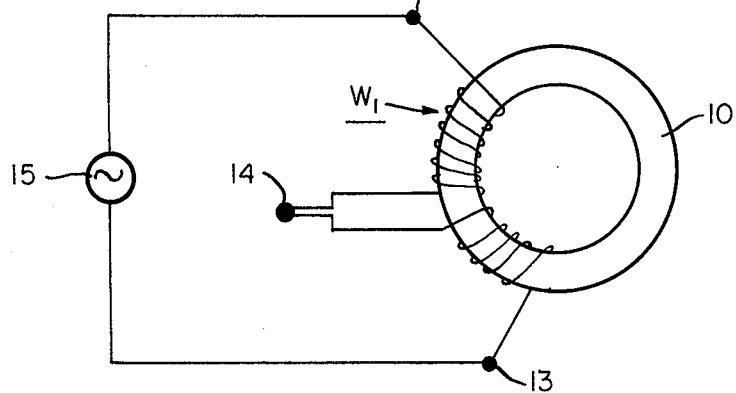
FIG. 1 is a schematic representation of a conventional ratio transformer.

FIG. 1 illustrates a simple circuit including a ratio transformer. The ratio transformer comprises a core 10 of magnetic material and a winding $W_1$ connected between terminals 12 and 13. An intermediate terminal 14 is brought out for purposes of connection. Those with ordinary skill in the art will realize that a plurality of intermediate terminals may be brought out for selective connection to, in effect, vary the turns ratio. Connected across terminals 12 and 13 is a source of alternating current 15.

The alternating current source 15 produces a current which flows through the winding connected to the terminals 12 and 13. This current induces a magnetic field. If the permeability of the core 10 were infinite all the magnetic flux would be contained within the magnetic material. There would be no leakage flux. Then, the voltage across any portion of the winding connected between terminals 14 and 13 would exactly equal the input voltage, that is the voltage across the terminals 12 and 13 multiplied by the turns ratio. The turns ratio is defined as the ratio between the number of turns between terminals 14 and 13 with respect to the number of turns between terminals 12 and 13. Since there is no leakage flux there will be no fractional turns. Thus, since there always are an integral number of turns it is a simple matter of counting turns to determine precise turns ratios.

Since a material of infinite permeability is not physically realizable any "real" transformer will exhibit some turns ratio error due to leakage flux. But many conventional magnetic materials have permeabilities much larger than that of air. And thus, by far the largest proportion of flux is contained in the magnetic material.

In addition, by making the geometry of the magnetic circuit toroidal, further reductions in leakage flux will be obtained. In a practical realizable ratio transformer, the total flux is so nearly confined to the magnetic core that ratio accuracies better than one part per million are readily achievable. The ratio transformer is thus inherently accurate without any necessity for great care in electrical assembly.

Figure 2:
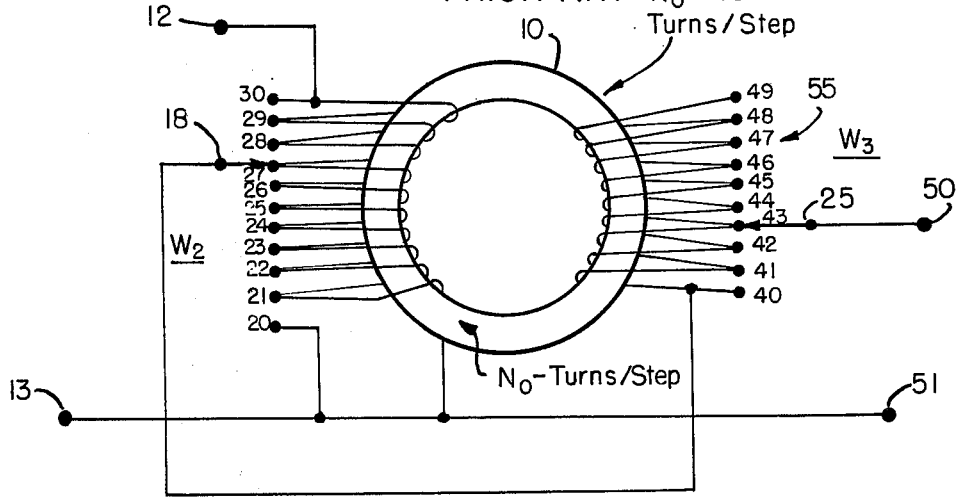
FIG. 2 is a part schematic and part plan view of a conventional ratio transformer whose turns ratio is accurately selectable in digital increments.

FIG. 2 illustrates a practical ratio transformer which is capable of achieving any turns ratio between 0 and 1.09 in one percent steps. In FIG. 2 a core of magnetic material 10 has two windings thereon. A first winding $W_2$ is connected between output terminals 12 and 13. This winding has a plurality of taps available for external connection; in the illustrated embodiment 11 taps 20-30 are available. By spacing each tap from another by a number of turns equal to 10% of the total number of turns between the terminals 12 and 13 a digitally selectable turns ratio is provided. Thus, for instance, the number of windings between terminals 20 and 21 is 10% of the number of windings between terminals 12 and 13. Thus, if contact 18 is connected to tap 26, for instance, the number of turns between contact 18 and terminal 13 will be 60% of the number of turns in the total windings.

A second winding $W_3$ is contained in the transformer with a second plurality of taps available for external connection. These taps, 40 through 49, each have an equal number of turns therebetween. However, the number of turns between taps of winding $W_3$ is only 10% of the number of turns between taps of winding $W_2$. By connecting tap 18 to tap 40 and connecting contact 25 to an input terminal 50, and connecting another input terminal 51 to terminal 13, a transformer is provided wherein the turns ratio is accurately settable in one percent increments from 0 to 1.09.

Figure 3:
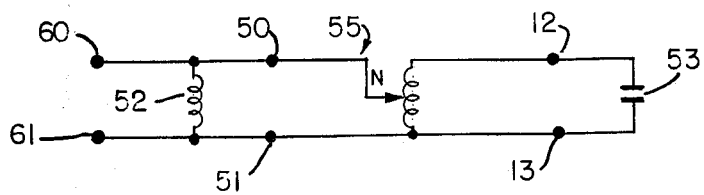
FIG. 3 illustrates a parallel tuned circuit in accordance with the teachings of this invention.

The transformer of FIG. 2 can be used in the present invention to provide a resonant circuit that has a resonant frequency which is accurately settable as shown in FIG. 3.

FIG. 3 illustrates a circuit of the present invention wherein the transformer 55 may be that shown in FIG. 2. An inductor 52 is connected between terminals 60 and 61. The input terminals 50-51 are connected across the inductor 52. Connected between output terminals 12 and 13 is a capacitor 53.

The resonant frequency of an LC circuit is given by the expression:

$$f = \frac{1}{2\pi \sqrt{LC}} \quad (1)$$

The resonant frequency thus varies inversely as the square root of the product of the inductance and the capacitance.

Transformer theory teaches that impedances are transformed in accordance with the square of the turns ratio, provided there is no leakage flux. This principle, together with the condition for resonance expressed by equation (1) allows for the accurate selectable tuning of the LC resonant circuit of FIG. 3 by varying the transformation ratio of the transformer. The capacitive reactance reflected from one winding to another in the transformer is related to the actual capacitance of capacitor 53 by the square of the turns ratio. Thus $C^1 = C/N^2$, where $C^1$ is the reflected capacitance. Substituting this reflected capacitance in our equation for the resonant frequency gives us equation (2) as follows:

$$f = \frac{N}{2\pi \sqrt{LC}} \quad (2)$$

Thus, the resonant frequency of the circuit varies directly as the turns ratio.

As has been explained with reference to FIG. 2, the turns ratio is easily and accurately varied by merely repositioning the taps 18 and 25.

The two windings of the ratio transformer 55, illustrated in FIG. 2, provide for any turns ratio N, $0 < N < 1.09$ in increments of 0.01N. It is within the scope of the present invention to cascade a number of ratio transformers in order to achieve even more finely selectable turns ratios. Further cascading transformers allows for more accuracy in selecting a particular turns ratio.

Figure 4:
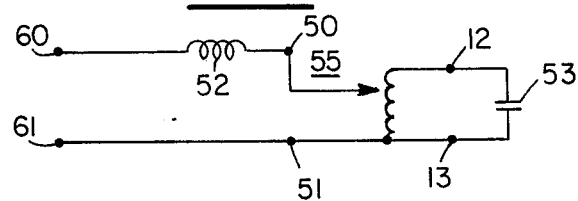
FIG. 4 illustrates a series tuned circuit in accordance with the teachings of this invention.

Furthermore, although FIG. 3 illustrated the tuned circuit with the capacitor 53 separated from the terminals 60-61 by the ratio transformer 55, it is within the scope of the present invention to interchange the relative positions of the inductor 52 and capacitor 53 in the circuit, i.e., to connect terminal 60-61 across capacitor 53. Although FIG. 3 illustrates a parallel type resonant circuit, those with ordinary skill in the art will understand that series tuned circuits may be used in the present invention as is illustrated in FIG. 4.

Since the transformer shown in FIG. 2 has two distinct windings, it is capable of achieving a turns ratio in 0.01N increments so that two place accuracy in a turns ratio is achievable. On the other hand, if single place accuracy is sufficient, the single winding of FIG. 1 will be sufficient. That figure illustrates a transformer whose turns ratio may be selectable in 0.1N increments provided the necessary terminals are available. It should also be apparent that the incremental steps between different selectable turns ratios is capable of wide variation, depending only on the number of turns between taps as compared to the total number of turns in the winding.

The foregoing description further discloses a discrete inductor and capacitor as being employed in the inventive circuit. However, it may be understood that, depending on the parameters of the transformer and the desired resonant frequency, parasitic effects of the transformer, such as the magnetizing inductance and stray capacitance, may supply some or all of the inductance and/or capacitance necessary for the circuit operation. To that extent the inductance or capacitance effect required by discrete devices may be reduced or eliminated.

What is claimed is:

1. A resonant circuit with a resonant frequency which is accurately selectable in digital increments corresponding to digital increments of a turns ratio of a transformer means included in said resonant circuit, said resonant circuit comprising, inductive means, capacitive means, transformer means with input and output terminals said output terminals having a fixed number of windings therebetween said transformer means having accurately selectable turns ratio in digital increments, said capacitive means connected to said output terminals of said transformer means and said inductive means connected to said input terminals, whereby said circuit resonants at a frequency which is directly proportional to said turns ratio and variations in said turns ratio produce directly proportional variations in said resonant frequency.

2. The circuit of claim 1 wherein said transformer means comprises a single winding with a plurality of taps having equal numbers of turns between different of said taps.

3. The circuit of claim 2 wherein said output terminals comprise a pair of terminals, each connected to extreme ends of said winding and said input terminals comprise a pair of terminals, one connected to a selected one of said taps and another connected to one of said output terminals.

4. The circuit of claim 1 which is parallel tuned.

5. The circuit of claim 1 which is series tuned.

6. The circuit of claim 1 in which said transformer means includes at least two windings, each of said windings having a plurality of taps, said first winding having a first equal number of turns between each of said taps, said second winding having a second equal number of windings between each of said taps, the ratio of said first and second equal numbers being an integer, a tap of said first winding connected to said second winding.

7. The circuit of claim 6 in which said output terminals comprise two terminals each connected to one extreme end of said first winding, said tap of said first winding connected to one extreme end of said second winding, one said input terminal connected to one of said output terminals, said other input terminal connected to one of said taps of said second winding.

8. The circuit of claim 6 which is parallel tuned.

9. The circuit of claim 6 which is series tuned.

* * * * *